US009711942B2

(12) United States Patent
Kanesaka

(10) Patent No.: US 9,711,942 B2
(45) Date of Patent: Jul. 18, 2017

(54) LASER APPARATUS AND OPTICAL TRANSMITTER

(71) Applicant: Fujitsu Optical Components Limited, Kawasaki-shi, Kanagawa (JP)

(72) Inventor: Hiroki Kanesaka, Santa Clara, CA (US)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

(21) Appl. No.: 14/922,741

(22) Filed: Oct. 26, 2015

(65) Prior Publication Data
US 2016/0141832 A1 May 19, 2016

(30) Foreign Application Priority Data

Nov. 19, 2014 (JP) .................. 2014-234196

(51) Int. Cl.
| H01S 3/04 | (2006.01) |
|---|---|
| H01S 5/042 | (2006.01) |
| H01S 5/024 | (2006.01) |
| H01S 5/00 | (2006.01) |
| H01S 5/06 | (2006.01) |
| H01S 5/0625 | (2006.01) |
| H01S 5/0687 | (2006.01) |
| G02F 1/01 | (2006.01) |
| H01S 5/50 | (2006.01) |

(52) U.S. Cl.
CPC .......... *H01S 5/042* (2013.01); *G02F 1/0123* (2013.01); *H01S 5/0014* (2013.01); *H01S 5/02415* (2013.01); *H01S 5/0617* (2013.01); *H01S 5/0687* (2013.01); *H01S 5/06256* (2013.01); *G02F 2203/60* (2013.01); *H01S 5/50* (2013.01)

(58) Field of Classification Search
CPC .................................. G01R 1/44; G01R 23/04
USPC ....................................................... 372/34, 36
See application file for complete search history.

(56) References Cited

U.S. PATENT DOCUMENTS

| 5,392,303 | A | | 2/1995 | Shiozawa et al. | |
|---|---|---|---|---|---|
| 6,002,299 | A | * | 12/1999 | Thomsen | ................ H03F 1/083 330/107 |
| 6,667,998 | B1 | * | 12/2003 | Lo | ........................ H01S 5/02415 372/34 |
| 2003/0185384 | A1 | * | 10/2003 | Bahl | ...................... H04M 19/00 379/387.01 |
| 2007/0147450 | A1 | * | 6/2007 | Inoue | ................... G11B 7/1263 372/38.02 |
| 2009/0021238 | A1 | * | 1/2009 | Ishikawa | ............... G02F 1/0147 324/95 |
| 2010/0033508 | A1 | * | 2/2010 | Mizushima | .......... G09G 3/3406 345/690 |
| 2010/0296532 | A1 | * | 11/2010 | Tanaka | ................ H01S 5/06256 372/20 |

(Continued)

FOREIGN PATENT DOCUMENTS

| JP | 6-338652 | 12/1994 |
|---|---|---|
| JP | 2011-18833 | 1/2011 |
| WO | WO 2011/048869 A1 | 4/2011 |

*Primary Examiner* — Tuan Nguyen
(74) *Attorney, Agent, or Firm* — Staas & Halsey LLP

(57) ABSTRACT

A laser apparatus includes a semiconductor laser of which a drive condition is controlled according to a plurality of types of drive currents and a controller which controls the drive condition such that a sum of the drive currents is equal to or less than a predetermined threshold value.

8 Claims, 10 Drawing Sheets

(56) References Cited

U.S. PATENT DOCUMENTS

2011/0006124 A1   1/2011  Kai
2012/0219024 A1   8/2012  Okamoto et al.

* cited by examiner

| Wavelength nm | Tambient degC | Tld degC | Igain mA | Idbr-f mA | Idbr-r mA |
|---|---|---|---|---|---|
| λ1 | T1 | Tld(λ1,T1) | Igain(λ1,T1) | Idbr-f(λ1,T1) | Idbr-r(λ1,T1) |
| λ1 | T2 | Tld(λ1,T2) | Igain(λ1,T2) | Idbr-f(λ1,T2) | Idbr-r(λ1,T2) |
| λ1 | T3 | Tld(λ1,T3) | Igain(λ1,T3) | Idbr-f(λ1,T3) | Idbr-r(λ1,T3) |
| λ1 | T4 | Tld(λ1,T4) | Igain(λ1,T4) | Idbr-f(λ1,T4) | Idbr-r(λ1,T4) |
| λ1 | T5 | Tld(λ1,T5) | Igain(λ1,T5) | Idbr-f(λ1,T5) | Idbr-r(λ1,T5) |
| λ1 | T6 | Tld(λ1,T6) | Igain(λ1,T6) | Idbr-f(λ1,T6) | Idbr-r(λ1,T6) |
| λ1 | T7 | Tld(λ1,T7) | Igain(λ1,T7) | Idbr-f(λ1,T7) | Idbr-r(λ1,T7) |
| λ1 | T8 | Tld(λ1,T8) | Igain(λ1,T8) | Idbr-f(λ1,T8) | Idbr-r(λ1,T8) |
| λ1 | T9 | Tld(λ1,T9) | Igain(λ1,T9) | Idbr-f(λ1,T9) | Idbr-r(λ1,T9) |
| λ1 | T10 | Tld(λ1,T10) | Igain(λ1,T10) | Idbr-f(λ1,T10) | Idbr-r(λ1,T10) |
| λ1 | T11 | Tld(λ1,T11) | Igain(λ1,T11) | Idbr-f(λ1,T11) | Idbr-r(λ1,T11) |
| λ1 | T12 | Tld(λ1,T12) | Igain(λ1,T12) | Idbr-f(λ1,T12) | Idbr-r(λ1,T12) |
| λ1 | T13 | Tld(λ1,T13) | Igain(λ1,T13) | Idbr-f(λ1,T13) | Idbr-r(λ1,T13) |
| λ1 | T14 | Tld(λ1,T14) | Igain(λ1,T14) | Idbr-f(λ1,T14) | Idbr-r(λ1,T14) |
| λ1 | T15 | Tld(λ1,T15) | Igain(λ1,T15) | Idbr-f(λ1,T15) | Idbr-r(λ1,T15) |
| λ1 | T16 | Tld(λ1,T16) | Igain(λ1,T16) | Idbr-f(λ1,T16) | Idbr-r(λ1,T16) |
| λ1 | T17 | Tld(λ1,T17) | Igain(λ1,T17) | Idbr-f(λ1,T17) | Idbr-r(λ1,T17) |
| λ1 | T18 | Tld(λ1,T18) | Igain(λ1,T18) | Idbr-f(λ1,T18) | Idbr-r(λ1,T18) |
| λ1 | T19 | Tld(λ1,T19) | Igain(λ1,T19) | Idbr-f(λ1,T19) | Idbr-r(λ1,T19) |
| λ1 | T20 | Tld(λ1,T20) | Igain(λ1,T20) | Idbr-f(λ1,T20) | Idbr-r(λ1,T20) |
| λ2 | T1 | Tld(λ2,T1) | Igain(λ2,T1) | Idbr-f(λ2,T1) | Idbr-r(λ2,T1) |
| λ2 | T2 | Tld(λ2,T2) | Igain(λ2,T2) | Idbr-f(λ2,T2) | Idbr-r(λ2,T2) |
| : | : | : | : | : | : |
| : | : | : | : | : | : |
| λ2 | T20 | Tld(λ2,T20) | Igain(λ2,T20) | Idbr-f(λ2,T20) | Idbr-r(λ2,T20) |
| : | : | : | : | : | : |
| : | : | : | : | : | : |
| : | : | : | : | : | : |
| λ90 | T1 | Tld(λ90,T1) | Igain(λ90,T1) | Idbr-f(λ90,T1) | Idbr-r(λ90,T1) |
| λ90 | T2 | Tld(λ90,T2) | Igain(λ90,T2) | Idbr-f(λ90,T2) | Idbr-r(λ90,T2) |
| : | : | : | : | : | : |
| λ90 | T20 | Tld(λ90,T20) | Igain(λ90,T20) | Idbr-f(λ90,T20) | Idbr-r(λ90,T20) | ns.

LASER APPARATUS AND OPTICAL TRANSMITTER

CROSS-REFERENCE TO RELATED APPLICATION

This application is based upon and claims the benefit of priority of the prior Japanese Patent Application No. 2014-234196, filed on Nov. 19, 2014, the entire contents of which are incorporated herein by reference.

FIELD

The embodiment(s) discussed herein is related to a laser apparatus and an optical transmitter.

BACKGROUND

In a technical field of optical communication, an optical transmitter with a tunable wavelength function has been commercialized. For example, a 10 G tunable XFP (10-Gigabit Small Form Factor Pluggable) module with a tunable TOSA (Transmitter Optical Sub-Assembly) has been commercialized.

A semiconductor laser such as a tunable laser diode (LD) is used for the tunable TOSA as a light emitting element. In order to stabilize an emission wavelength, the semiconductor laser is controlled in drive conditions based on a temperature monitor of the semiconductor laser, or is temperature-constant-controlled by using a thermoelectric cooler (TEC).

A specification in power consumption of a TOSA is defined at about less than 3.5 watts (W) in a normal operational temperature range (illustratively, −5° C. to +70° C.)

Meanwhile, in recent years, for the purpose of a high-density packaging of an optical transmitter, there is a demand for expanding the operational temperature range (illustratively, −5° C. to +85° C.) of the TOSA while maintaining the power consumption.

Further, there is a demand for a tunable SFP+ module in power consumption being less than 1.5 W in the normal operational temperature range (illustratively, −5° C. to +70° C.).

In view of the above background, it is important to reduce power consumption of the tunable TOSA (in other words, a laser module or a laser apparatus).

SUMMARY

According to one aspect, a laser apparatus may include: a semiconductor laser of which a drive condition is controlled according to a plurality of types of drive currents; and a controller configured to control the drive condition such that a sum of the drive currents is equal to or less than a predetermined threshold value.

Further, according to another aspect, an optical transmitter may include the above laser apparatus.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 is a diagram illustrating an example of a lookup table stored in a memory illustrated in FIG. 1;

DESCRIPTION OF EMBODIMENTS

Figure 1:
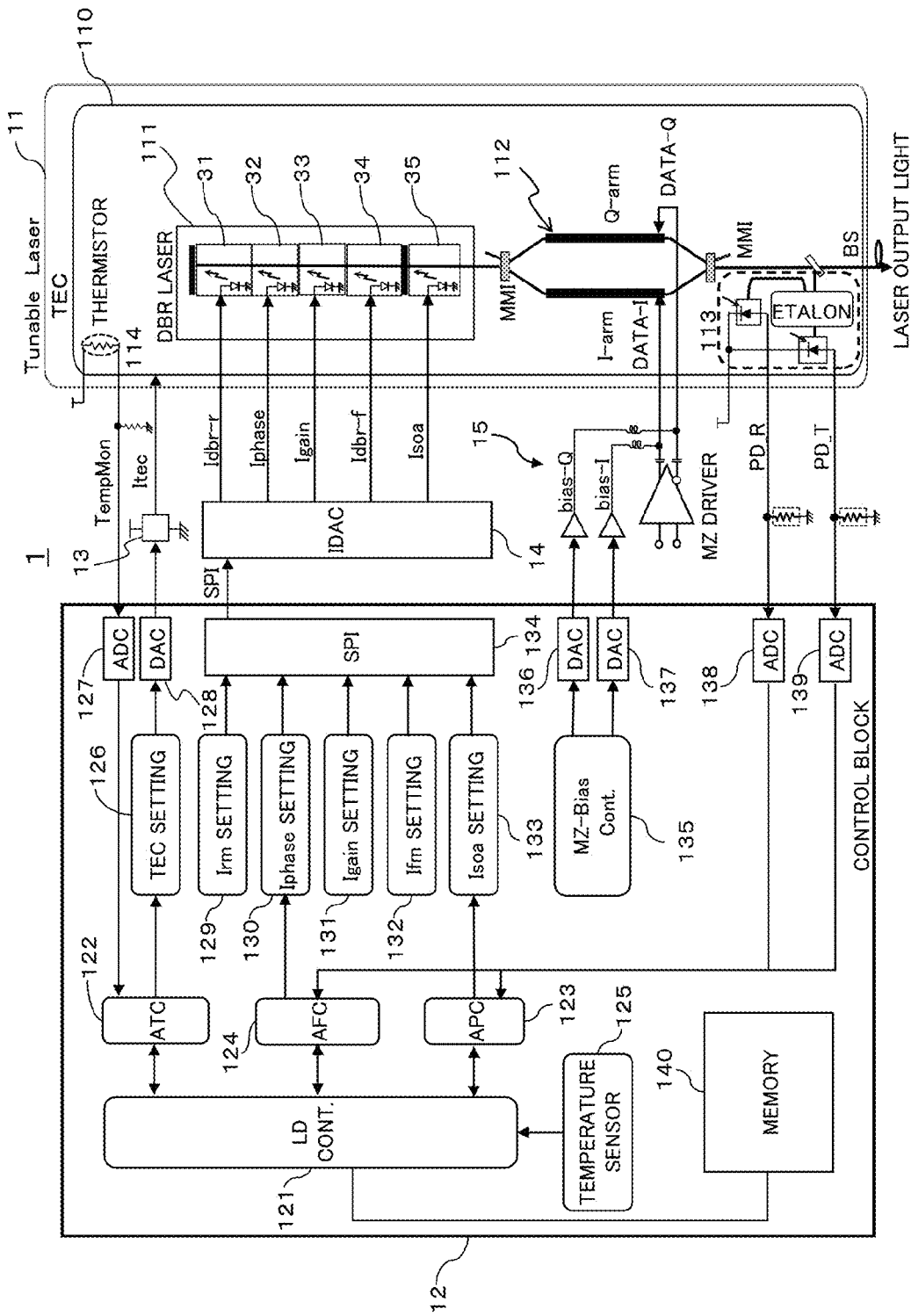
FIG. 1 is a block diagram illustrating an exemplary configuration of a laser apparatus according to one embodiment.

An embodiment will be described below with reference to the drawings. Meanwhile, the embodiment described below is only an illustrative embodiment, and does not intend to exclude various modifications and an application of techniques which are not explicitly described below. Further, various illustrative aspects described below may be optionally combined and carried out. In addition, portions assigned the same reference numerals in the drawings used in the following embodiment represent similar or the same portions unless otherwise specified.

FIG. 1 is a block diagram illustrating an exemplary configuration of a laser apparatus according to one embodiment. The laser apparatus 1 illustrated in FIG. 1 is a DBR laser apparatus 1, for example, and includes a tunable laser block 11 and a control block 12. The laser apparatus 1 may also be referred to as a "laser module 1". The laser module 1 may be provided in, for example, a TOSA of an optical transmitter.

The tunable laser block 11 illustratively includes a DBR laser 111, an optical modulator 112 and a wavelength locker 113. The DBR laser 111 is an example of a semiconductor laser diode (LD) whose emission wavelength (which may also be referred to as an "oscillation wavelength") is tunable.

The DBR laser 111, the optical modulator 112 and the wavelength locker 113 may be illustratively provided on a thermoelectric cooler (TEC) 110. Temperatures of the DBR laser 111, the optical modulator 112 and the wavelength locker 113 may be controlled to target temperatures by using the TEC 110.

The TEC 110 is an example of a device operable to heat and cool an object by using a Peltier effect provided by a Peltier element. The Peltier element causes a heat generation phenomenon by applying a current to a joint portion of two thermoelectron materials (bismuth and tellurium), and causes an endothermic effect by reversing a direction of the current to be applied (in other words, a positive or negative polarity of a current).

The TEC 110 may be provided with a thermistor 114 which is an example of a temperature sensor to control the temperature of the TEC 110. Based on temperature information detected by the thermistor 114, the control block 12 may control (or feedback control) the temperature of the TEC 110 (may also be referred to as a "TEC temperature" below).

The feedback control of the TEC temperature may be illustratively performed by the TEC driver 13. The TEC driver 13 generates a current corresponding to control information of the TEC temperature supplied from the control block 12, and supplies the current to the TEC 110. This current may also be referred to as a "TEC current (Itec)".

Figure 2:
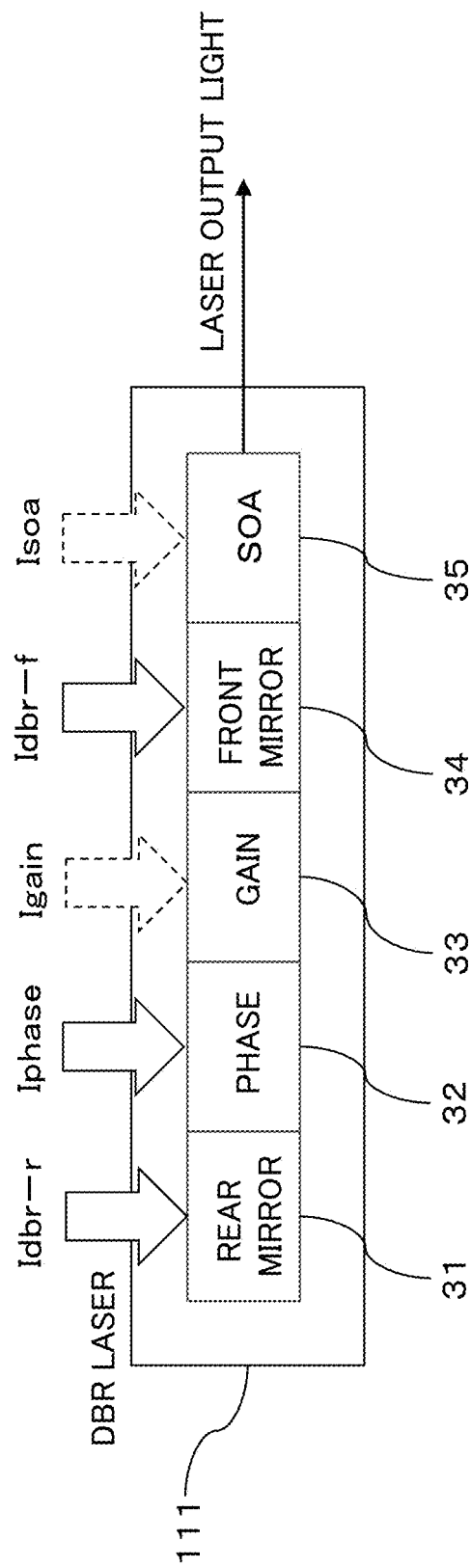
FIG. 2 is a block diagram illustrating a configuration example of a DBR (Distributed Bragg Reflection) laser illustrated in FIG. 1.

As illustrated in FIGS. 1 and 2, the DBR laser 111 may include a rear mirror portion 31, a phase portion 32, a gain portion 33, a front mirror portion 34 and a semiconductor amplifier (SOA) portion 35. Each of these portions 31 to 35 may also be referred to as "regions 31 to 35", respectively.

A portion including the gain portion 33 and the SOA portion 35 may be referred to as an "active portion (or region)" and a portion including the phase portion 32, the front mirror portion 34 and the rear mirror portion 31 may be referred to as a "tuning portion (or region)".

When a current is injected in the gain region 33 in the active region, the gain region 33 serving as an active layer is activated according to the current and emits light. The current injected in the gain region 33 may also be referred to as a "gain current (Igain)". The "gain current" may also be referred to as a "drive current" or a "laser drive current" of the DBR laser 111.

The light beam emitted by the gain region 33 is amplified by the SOA region 35. By controlling the current injected to the SOA region 35 (may be referred to as a "SOA drive current"), it is possible to perform stabilization control of output light power of the DBR laser 111. The "SOA drive current" may be abbreviated to a "SOA current (Isoa)".

It may be understood that the above TEC current (Itec), the SOA current (Isoa) and the laser drive current (Igain) correspond to examples of first, second and third drive currents, respectively.

Meanwhile, in the tuning region, the front mirror region 34 and the rear mirror region 31 are both refraction gratings, and reflect light beams emitted by the gain unit 33. Hence, cyclic reflected light peaks (which may be referred to as "Bragg Peaks") are obtained by the refraction gratings 31 and 34.

In this regard, cycles of the two refraction gratings 31 and 34 are set slightly different from each other. Hence, in a wavelength domain (in other words, a frequency domain), cyclic reflected light peaks obtained by the front mirror region 34 and the rear mirror region 31 are shifted.

Figure 3:
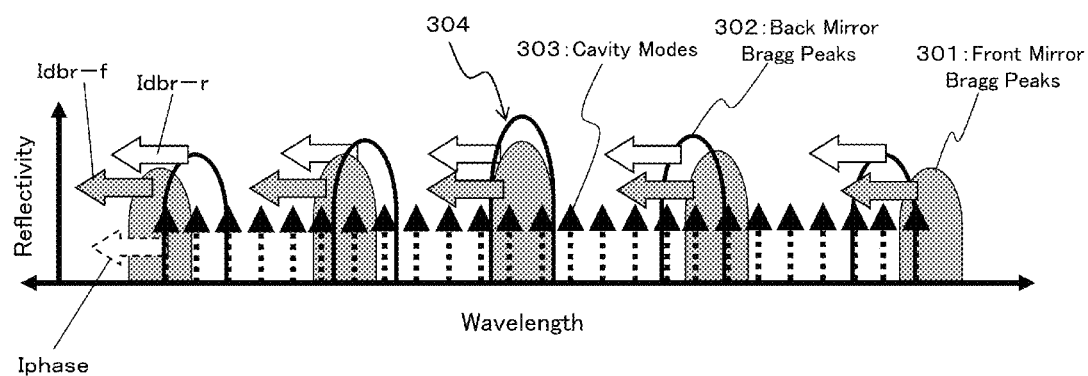
FIG. 3 is a diagram for explaining an oscillating operation of the DBR laser illustrated in FIGS. 1 and 2.

For example, as illustrated in FIG. 3, a reference numeral 301 denotes a cyclic reflected light peak obtained by the front mirror region 34, and a reference numeral denotes a cyclic reflected light peak obtained by the rear mirror region 31. A horizontal axis in FIG. 3 indicates a wavelength (in other words, a frequency), and the vertical axis indicates a reflectance. Further, a dotted-line arrow 303 indicates a cavity mode.

As indicated by an arrow 304, optical resonance (or oscillation) occurs at a specific wavelength at which the cyclic reflected light peak 301 obtained by the front mirror region 34 and the cyclic reflected light peak 302 obtained by the rear mirror region 31 overlap. In this way, the DBR laser is oscillated and emits light.

The reflected light peaks obtained by the mirror regions 31 and 34 can be relatively shifted in a wavelength domain by controlling one or both of mirror angles of the mirror regions 31 and 34. By relatively shifting the reflected light peaks, it is possible to vary (or control) an oscillation wavelength.

Each mirror angle can be illustratively controlled (may also be referred to as "set") by a current. A current to control the mirror angle may be referred to as a "mirror current". A mirror current of the rear mirror region 31 may be referred to as "Idbr-r", and a mirror current of the front mirror region 34 may be referred to as "Idbr-f".

Further, by controlling a current to be injected to the phase region 32 to shift the cavity mode 303, it is possible to apply a fine adjustment to the oscillation frequency to stabilize the oscillation wavelength. The current injected to the phase region 32 may also be referred to as a "phase current (Iphase)". In relation to the "fine adjustment" of the oscillation wavelength performed by the phase current control, control of an oscillation wavelength performed by the above mirror current control may be referred to as a "rough adjustment".

As illustrated in FIG. 1, a current to be supplied to each region 31 to 35 of the DBR laser 111 may be controlled by the control block 12. Illustratively, the control block 12 is connected to a current digital-analog converter (IDAC) 14, and the IDAC 14 converts a digital current value supplied from the control block 12 into an analog current value.

The analog current value is a current value corresponding to any one of the rear mirror current Idbr-r, the phase current Iphase, the laser drive current Igain, the front mirror current Idbr-f and the SOA current Isoa. Each analog current value is supplied to a region corresponding to any one of the regions 31 to 35 of the DBR laser 111.

A serial peripheral interface (SPI) 134 is applicable to a connection interface between the control block 12 and the IDAC 14, for example. The control block 12 is operable to supply a digital current value to the IDAC 14 by way of communication through the SPI 134.

The optical modulator 112 illustrated in FIG. 1 modulates output light of the DBR laser 111 with a drive signal. The optical modulator 112 may be illustratively a Mach-Zehnder (MZ) modulator. The drive signal may be a transmission data signal, and continuous light output from the DBR laser 111 may be modulated according to the transmission data signal.

The MZ modulator 112 may include, for example, a splitter configured to branch output light of the DBR laser 111 into two light beams, two waveguides configured to guide the branched light beams and a combiner configured to combine the light beams guided in the two waveguides.

Multimode interference (MMI) waveguide couplers are applicable to the splitter and the combiner. The two waveguides may be referred to as "arms", respectively. Each arm is illustratively provided with a drive electrode which receives a drive signal.

One drive electrode is supplied an in-phase (I) component of the drive signal, and the other drive electrode is supplied a quadrature (Q) component of the drive signal. The arm corresponding to the drive electrode supplied the I component may be referred to as an "I arm", and the arm corresponding to the drive electrode supplied the Q component may be referred to as a "Q arm".

The drive signal is illustratively supplied by a driver unit 15. The driver unit 15 may illustratively include a driver amplifier which generates a drive signal and a bias amplifier which controls a bias voltage of the MZ modulator 112.

The light beams propagating in the I arm and the Q arm change in phases according to the drive signals supplied to the corresponding drive electrodes, and then an interference state at the MMI waveguide coupler serving as an example of a combiner changes.

Thus, light pulses occur in the output of the combiner according to the drive signals. In this way, output light of the DBR laser 111 is modulated by the MZ modulator 112 according to the drive signals.

The wavelength of the output light of the MZ modulator 112 may be stabilized (or locked) by the wavelength locker 113. The wavelength locker 113 may include an optical detector to detect the wavelength and power of the output light of the DBR laser 111. The "Detection" may be referred to as a "monitor".

Hence, it may be understood that the wavelength locker 113 corresponds to an example of a monitor operable to monitor an output light wavelength and output light power of the DBR laser 111. A photodetector (or a photodiode) (PD) is applicable to the optical detector.

In FIG. 1, "PD_R" represents the PD which detects a wavelength and detection information of the PD and "PD_T" represents the PD which detects power and detection information of the PD. The wavelength locker 113 may be provided with an etalon element available to control the temperature of the wavelength locker 113.

The wavelength information and the power information of the output light of the DBR laser 111 detected by the wavelength locker 113 may be used for wavelength control of the DBR laser 111 performed by the control block 12.

The control block 12 illustratively performs temperature control of the TEC 110 and performs wavelength control of the DBR laser 111. The control block 12 may be realized by using a processor circuit or a processor device such as a CPU (Central Processing Unit) having an arithmetic capability. The "control block 12" may be simply referred to as a "controller".

The control block 12 may include, for example, an LD controller 121, a temperature controller 122, a power controller 123, a frequency (or wavelength) controller 124 and a temperature sensor 125.

Further, the control block 12 may include, for example, a TEC setting unit 126, a rear mirror current setting unit 129, a phase current setting unit 130, a gain current setting unit 131, a front mirror current setting unit 132, an SOA current setting unit 133 and a MZ bias controller 135. It may be understood that the TEC setting unit 126 and each current setting unit 129 to 133 constitute a driver available to output a plurality of types of drive currents to control drive conditions of the DBR laser 111.

Further, the control block 12 may include, for example, analog-digital converters (ADC) 127, 138 and 139, digital-analog converters (DAC) 128, 136 and 137, an SPI 134 and a memory 140.

The temperature sensor 125 detects (or senses) a surrounding temperature (which may also be referred to as an "ambient temperature") Ta of the tunable laser block 11. It may be understood that "T" of the "Ta" represents a head character of "Temperature" and "a" of the "Ta" represents a head character of "ambient".

The LD controller 121 sets or controls a TEC temperature, output light power of the DBR laser 111 and the output light wavelength of the DBR laser 111 in cooperation with the temperature controller 122, the power controller 123 and the frequency controller 124.

For example, the temperature controller 122 performs temperature stabilization control on the DBR laser 111 by controlling the TEC current to control the TEC temperature based on an output voltage value of the thermistor 114 obtained through the ADC 127.

The control of the TEC current is performed by supplying setting information of the TEC current to the TEC driver 13 through the DAC 128 from the TEC setting unit 126 in response to control from the temperature controller 122, for example.

The TEC driver 13 supplies to the TEC 110 the TEC current corresponding to the setting information supplied from the DAC 128.

The above temperature control performed by the temperature controller 122 may be referred to as an ATC (Automatic Temperature Control). Hence, the temperature controller 122 may be referred to as an ATC (Automatic Temperature Controller) 122.

Under environment in which the ATC performs the temperature stabilization control, the gain current (Igain) and the SOA current (Isoa) are respectively supplied to the gain region 33 and the SOA region 35 of the DBR laser 111 and then the DBR laser 111 emits a light beam.

The gain current (Igain) injected to the gain region 33 is illustratively set (or controlled) by the gain current setting unit 131 through the SPI 134 and the IDAC 14. The SOA current (Isoa) injected in the SOA region 35 is illustratively set (or controlled) by the SOA current setting unit 133 through the SPI 134 and the IDAC 14.

The emission power of the DBR laser 111 is controlled and stabilized by the power controller 123, for example. The emission wavelength of the DBR laser 111 is controlled and stabilized by the frequency controller 124, for example.

For example, the power controller 123 controls the SOA current (Isoa) based on the output light power information of the DBR laser 111 detected by the wavelength locker 113 and obtained through the ADC 139. Thus, the emission power of the DBR laser 111 is stabilized.

The control of the SOA current Isoa is performed by supplying setting information of the SOA current to the IDAC 14 through the SPI 134 from the SOA current setting unit 133 in response to control from the power controller 124, for example.

The IDAC 14 supplies to the SOA region 35 of the DBR laser 111 the SOA current corresponding to the setting information of the SOA current supplied from the control block 12 through the SPI 134.

The above emission power control of the DBR laser 111 performed by the power controller 123 may be referred to as APC (Automatic Power Control). Hence, the power controller 123 may be referred to as an APC (Automatic Power Controller) 123.

Meanwhile, the control of the emission wavelength of the DBR laser 111 is available by controlling, as described above with reference to FIG. 3, one or both of the rear mirror current and the front mirror current to relatively shift the reflected light peaks obtained by the refraction gratings 31 and 34 in the wavelength domain. The rear mirror current may be represented by "Idbr-r" or "Irm" and the front mirror current may be represented by "Idbr-f" or "Ifm".

The control (or setting) of the rear mirror current may be performed by the rear mirror current (Irm) setting unit 129 through the SPI 134 and the IDAC 14. The control (or setting) of the front mirror current may be performed by the front mirror current (Ifm) setting unit 132 through the SPI 134 and the IDAC 14.

By controlling one or both of the mirror currents, it is possible to control (or roughly adjust) the output light wavelength of the DBR laser 111 to a target wavelength. Further, the frequency controller 124 performs the fine adjustment on the DBR laser 111 to stabilize the emission wavelength of the DBR laser 111.

For example, the frequency controller 124 controls the phase current (Iphase) injected to the phase region 32 of the DBR laser 111 based on the output light wavelength information of the DBR laser 111 detected by the wavelength locker 113 and obtained through the ADC 138.

In response to control of the phase current (Iphase), the cavity mode is controlled as described with reference to FIG. 3. Hence, it is possible to control (or finely adjust) and stabilize the emission wavelength of the DBR laser 111.

The above emission wavelength control of the DBR laser 111 performed by the frequency controller 124 may be referred to as an AFC (Automatic Frequency Control). Hence, the frequency controller 124 may be referred to as an AFC (Automatic Frequency Controller) 124.

As described above, the DBR laser 111 is subjected to a combination of two or three of the ATC, the APC and the AFC by the control block 12, and therefore, the temperature, the emission power and the emission wavelength of the DBR laser 111 are set, controlled or tuned. In other words, the drive conditions of the DBR laser 111 are controlled by any of the ATC, APC and the AFC.

The MZ bias controller 135 supplies information to control (or set) a bias voltage of the MZ modulator 112 to the driver unit 15 (or bias amplifier) through the DACs 136 and 137. Control of the bias voltage does not influence the ATC, APC and the AFC of the DBR laser 111.

Next, a relationship between the ambient temperature Ta of the DBR laser 111 detected by the temperature sensor 125 and a temperature Tld of the DBR laser 111 stabilized by the above-described ATC will be described. The temperature Tld of the DBR laser 111 may be referred to as a "laser setting temperature (Tld)" for descriptive purposes.

As a difference between the ambient temperature Ta and the setting temperature Tld of the DBR laser 111 is large, a temperature control range (or step width) required for the TEC 110 becomes wide. Hence, the TEC current (Itec) increases, and power consumption of the laser apparatus 1 increases.

By raising the laser setting temperature Tld, it is possible to reduce the TEC current Itec when the ambient temperature Ta is a high temperature. However, by contrast with this, the TEC current Itec increases when the ambient temperature Ta is a low temperature.

Figure 4:
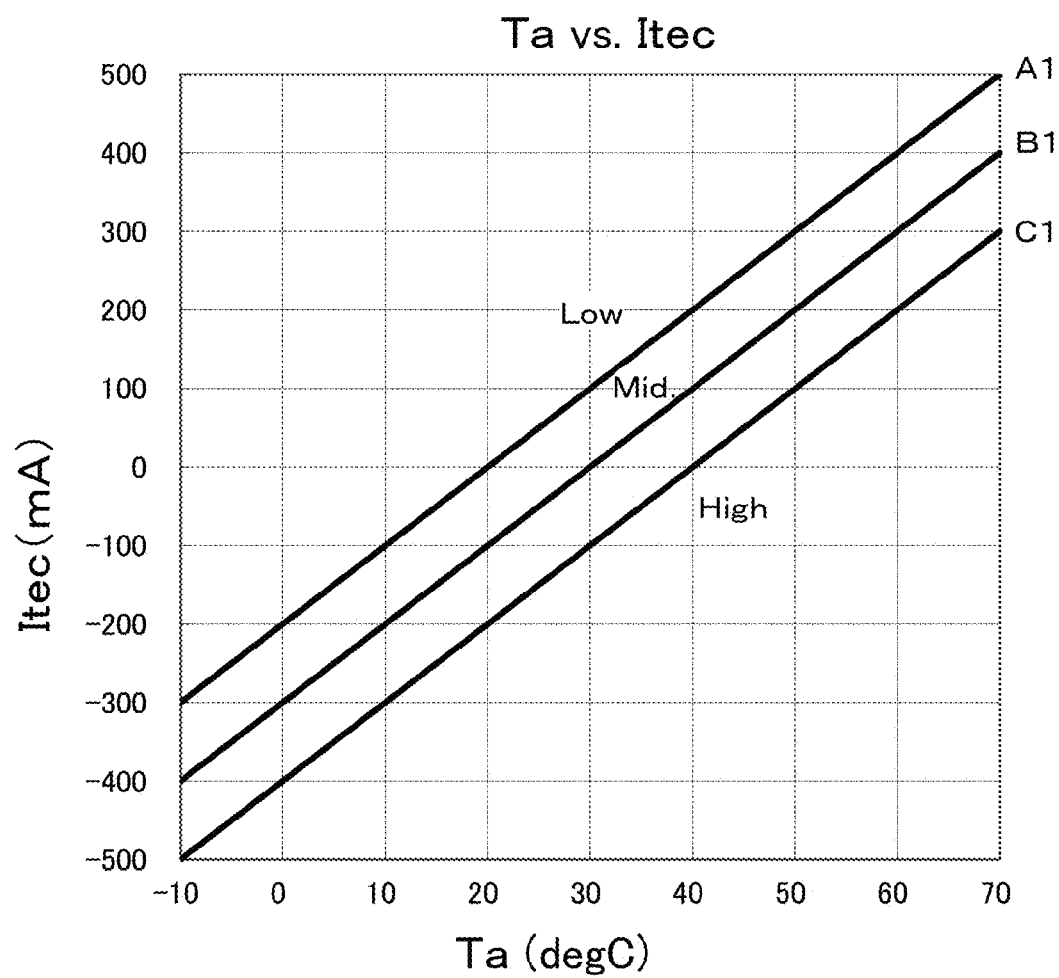
FIG. 4 is a diagram illustrating an example of characteristics of a drive current (Itec) of a thermoelectric cooler (TEC) with respect to an environmental temperature (Ta) of the DBR laser.

An example of this case will be described with reference to FIG. 4. FIG. 4 is a diagram illustrating an example of characteristics of the TEC current Itec with respect to the ambient temperature Ta of the DBR laser 111. It may be understood that the characteristics correspond to an example of a first relationship. In FIG. 4, a horizontal axis indicates the ambient temperature Ta [° C.], and illustratively indicates a temperature range in which the DBR laser 111 can normally operate. The horizontal axis represents the TEC current [mA], and, illustratively, "cooling" is performed by using the positive (+) TEC current Itec and "heating" is performed by using the negative (−) TEC current Itec.

Further, in FIG. 4, characteristics indicated by A1, B1 and C1 are characteristics examples where the laser setting temperature (Tld) is at a low temperature (Low), an intermediate temperature (Mid) and a high temperature (High), respectively. A non-restrictive example of Tld (Low)=20° C., Tld (Mid)=30° C. and Tld (High)=40° C. may be assumed.

As illustrated in FIG. 4, even in case of characteristics A1, B1 and C1, when a difference between the ambient temperature Ta and the laser setting temperature Tld is minimum, the TEC temperature does not need to be controlled, and therefore the TEC current Itec may be 0 [mA].

In contrast, as the difference between the ambient temperature Ta and the laser setting temperature Tld is large, greater cooling effect or heating effect would be required for the TEC 110 to adjust the temperature of the DBR laser 111 close to the setting temperature Tld; therefore, the TEC current Itec increases.

In this regard, when the ambient temperature Ta is in a temperature range in which the DBR laser 111 needs to be cooled, it is possible to reduce the cooling effect required for the TEC 110 by increasing the laser setting temperature Tld. Hence, it is possible to reduce the TEC current Itec upon cooling.

However, when the laser setting temperature Tld is raised and when the ambient temperature Ta is in a temperature range in which the DBR laser 111 needs to be heated, a heating effect required for the TEC 110 becomes greater, and therefore, the TEC current Itec upon heating increases.

For example, in case of the ambient temperature Ta=70° C., by setting the laser setting temperature Tld to Tld (High)=40° C. higher than Tld (Mid)=30° C. (changing the characteristics B1 to the characteristics C1), it is possible to reduce the TEC current Itec upon cooling.

However, under the ambient temperature Ta=0° C., since the characteristics C1 bring a greater difference from the laser setting temperature Tld than that of the characteristics B1, a greater heating effect is required for the TEC 110 and the TEC current Itec increases upon heating.

Contrary to the above, when the ambient temperature Ta is in the temperature range in which the DBR laser 111 needs to be heated, it is possible to lower the heating effect required for the TEC 110 by decreasing the laser setting temperature Tld. Hence, it is possible to reduce the TEC current Itec upon heating.

However, when the laser setting temperature Tld is lowered and when the ambient temperature Ta is in the temperature range in which the DBR laser 111 needs to be cooled, the cooling effect required for the TEC 110 becomes greater, and therefore, the TEC current Itec increases upon cooling.

For example, by setting the laser setting temperature Tld to Tld (Low)=20° C. lower than Tld (Mid)=30° C. (changing the characteristics B1 to the characteristics A1) in case of the ambient temperature Ta=0° C., it is possible to reduce the TEC current Itec upon heating.

However, under the ambient temperature Ta=70° C., since the characteristics A1 bring a greater difference from the laser setting temperature Tld than that of the characteristics B1, a greater cooling effect is required for the TEC 100, and therefore, the TEC Itec increases upon cooling.

Further, even when the TEC current Itec can be reduced upon cooling by raising the laser setting temperature Tld, since a differential efficiency of the DBR laser 111 depends on temperature, as the laser setting temperature Tld becomes high, laser output light power lowers when the gain current Igain is maintained at a constant value.

Figure 5:
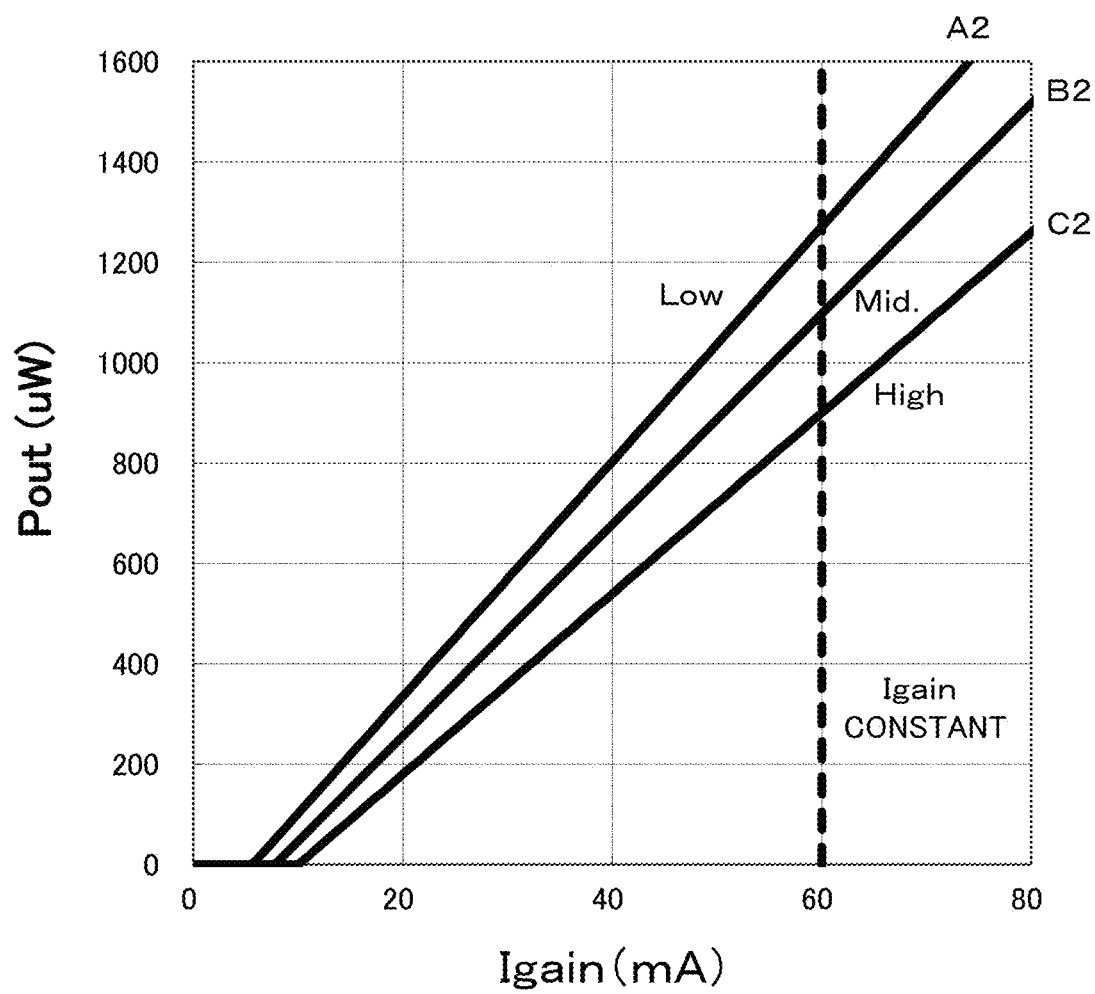
FIG. 5 is a diagram illustrating an example of characteristics between a laser drive current (Igain) and output light power (I-L) corresponding to a laser setting temperature (Tld)

FIG. 5 illustrates an example of characteristics between the laser drive current (Igain) and output light power (I-L) corresponding to the laser setting temperature Tld. In FIG. 5, a horizontal axis indicates a laser drive current (Igain) [mA], and a vertical axis indicates laser output light power [µW].

Further, similar to FIG. 4, in FIG. 5, the characteristics indicated by A2, B2 and C2 are characteristics examples where the laser setting temperature Tld is at a low temperature (Low), an intermediate temperature (Mid) and a high temperature (High), respectively. A non-restrictive example of Tld (Low)=20° C., Tld (Mid)=30° C. and Tld (High)=40° C. may be assumed.

For example, in FIG. 5, when the drive current Igain is constant (e.g. constantly at 60 mA as indicated by a dotted line), as the laser setting temperature Tld is raised, laser output light power is lowered. In other words, it may be understood that the characteristics illustrated in FIG. 5 correspond to an example of a second relationship indicative of a relationship between the laser setting temperature Tld for the ambient temperature Ta and temperature dependency loss of output light power corresponding to temperature control of the DBR laser 111.

In order to compensate for a decrease in (or loss of) laser output light power of such temperature dependency in order to obtain predetermined laser output light power, it would be effective to increase an SOA current to increase an SOA gain. In other words, the SOA current may be controlled to compensate for temperature dependency loss of laser output light power according to temperature control of the DBR laser 111.

However, a power consumption reduction effect obtained by reducing the TEC current is canceled by an increase in the SOA current and weakens. In other words, the laser setting temperature Tld which is optimal in terms of power consumption also changes in response to a change in the ambient temperature Ta.

Further, when the laser drive current Igain is controlled in constant by the APC, since the SOA unit 35 has a wavelength dependent gain, an SOA current is increased to obtain target laser output light power in a wavelength band of a low gain and power consumption increases. Hence, it is more effective in terms of power consumption to increase the laser drive current Igain to increase laser output light power rather than increasing the SOA current Isoa.

Figure 6:
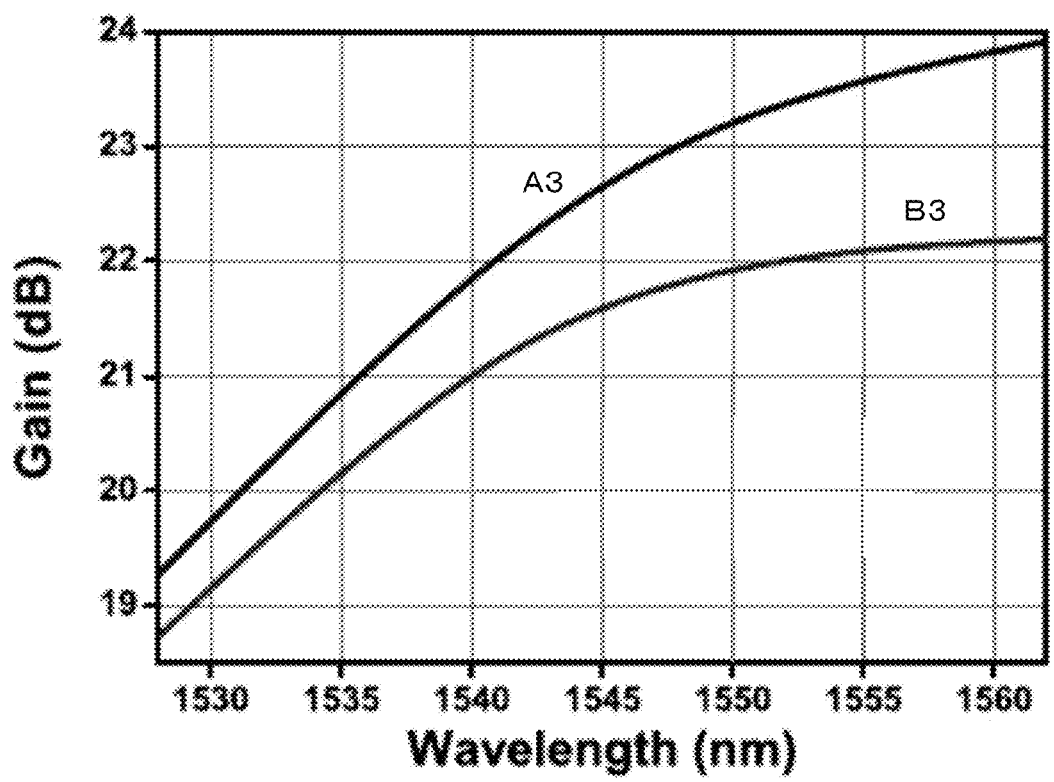
FIG. 6 is a diagram illustrating an example of characteristics of an amplification gain with respect to a wavelength when a drive current in a semiconductor amplification region of the DBR laser is constant.

FIG. 6 illustrates an example of characteristics of an SOA gain with respect to a wavelength when an SOA current is constant. It may be understood that the characteristics correspond to an example of a third relationship. In FIG. 6, a horizontal axis indicates a wavelength [nm], and a vertical axis indicates an SOA gain [dB]. Further, in FIG. 6, A3 represents a change (or characteristics) in a maximum value of an SOA gain with respect to a wavelength, and B3 represents a change (or characteristics) of a minimum value of the SOA gain with respect to the wavelength.

As illustrated in FIG. 6, as a wavelength is shorter, an SOA gain tends to decrease, and therefore, it is possible to obtain target laser output light power by increasing the SOA current Isoa under the APC which controls the laser drive current Igain to be constant. In other words, depending on a setting of an emission wavelength (λ) of the DBR laser 111 (also referred to as a "laser setting wavelength" below), the laser drive current Igain optimal for power consumption changes.

Hence, in the present embodiment, the control block 12 may control (or ATC) the laser setting temperature (Tld) such that, for example, a sum of the TEC current (Itec) and the SOA current (Isoa) becomes minimum according to the ambient temperature Ta. This control may be referred to as a "laser setting temperature (Tld) optimization control".

Alternatively or additionally, the control block 12 according to the present embodiment may control the laser drive current Igain such that a sum of the laser drive current Igain and the SOA current Isoa becomes minimum according to a laser setting wavelength λ under the APC which controls the laser output light power to be constant. This control may be referred to as a "laser drive current (Igain) optimization control".

In other words, the control block 12 according to the present embodiment may control the laser setting temperature (Tld) and the laser drive current Igain (in other words, may perform the ATC and the APC) such that a total sum of the TEC current Itec, the laser drive current Igain and the SOA current Isoa becomes minimum according to the ambient temperature Ta and the laser setting wavelength λ.

For example, in the memory 140, a setting value of the laser setting temperature Tld and a setting value of the laser drive current Igain are stored per ambient temperature Ta and per laser setting temperature λ. As a non-restrictive example, these items of data (which may be referred to as "parameters") may be stored in table format (e.g. lookup table) in the memory 140.

The memory 140 is an example of a memory, a memory device or a memory medium, and may be a random access memory (RAM), a hard disk drive (HDD) or a solid state drive (SSD).

The control block 12 (e.g. the LD controller 121) reads from the memory 140 setting values of the laser setting temperature Tld and the laser drive current Igain, which correspond to the ambient temperature Ta detected by the temperature sensor 125 and the laser setting wavelength λ. Thus, it is possible to perform the above optimization control.

The setting values of the laser setting temperature Tld and the laser drive current Igain can be illustratively obtained by a simulation or the like based on the characteristics illustrated in FIGS. 4 to 6.

For example, these setting values may be obtained by a simulation or the like based on temperature characteristics of a TEC current, temperature characteristics of a differential efficiency of the DBR laser 111 (in other words, temperature characteristics of an SOA gain) and wavelength characteristics of the SOA gain.

However, these setting values may be obtained based on measurement values measured by experimentally changing the ambient temperature Ta and the laser setting wavelength λ.

When the laser setting temperature Tld changes, reflection characteristics of the mirror regions 31 and 34 of the DBR laser 111 change to cause a fluctuation of an oscillation wavelength.

Such a fluctuation of the oscillation wavelength can be compensated for by storing setting value of mirror currents available to cancel a reflection characteristics fluctuation in the memory 140 per laser setting temperature Tld.

The fluctuation of the oscillation wavelength, which occurs in response to a change in the laser drive current Igain, can be compensated for likewise by storing setting values of mirror currents available to cancel reflection characteristics fluctuation, in the memory 140 per laser drive current Igain.

FIG. 7 illustrates an example of a lookup table LT stored in the memory 140. As a non-restrictive example, in the lookup table LT illustrated in FIG. 7, setting values of the laser setting temperature Tld and the laser drive current Itec corresponding to 20 different ambient temperatures Ta=T1 to T20 are registered for 90 wavelengths of laser setting wavelengths λ1 to λ90.

In addition, setting values of the front mirror current Idbr-f and the rear mirror current Idbr-r corresponding to 20 temperatures are also registered for the 90 wavelengths. The setting values of these mirror currents Idbr-f and Idbr-r may be optional.

It may be understood that these setting values correspond to information obtained in advance to satisfy conditions that a total sum of the TEC current Itec, the laser drive current Igain and the SOA current Isoa becomes minimum.

The lookup table LT illustrated in FIG. 7 is an exemplary table where the Tld optimization control according to the ambient temperature Ta and the Igain optimization control according to the laser setting wavelength λ are performed in combination. When only one of the optimization controls are to be performed, parameters related to the other control may be fixed.

For example, when only the Tld optimization control according to the ambient temperature Ta is to be performed, the setting value of the laser drive current Igain for the laser setting wavelength λ may be fixed in the lookup table LT. In this case, it may be understood that the setting value of the laser setting temperature Tld corresponds to information satisfying conditions that a sum of the TEC current Itec and the SOA current Isoa becomes minimum.

Meanwhile, when only the Igain optimization control according to the laser setting wavelength λ is to be performed, the setting value of the laser setting temperature Tld for an ambient temperature may be fixed in the lookup table LT. In this case, it may be understood that the setting value of the laser drive current Igain corresponds to information satisfying conditions that a sum of the laser drive current Igain and the SOA current Isoa is minimum.

Next, an example of an effect obtained by the above-described Tld optimization control and Igain optimization control will be described with reference to FIGS. 8 to 10.

Figure 8:
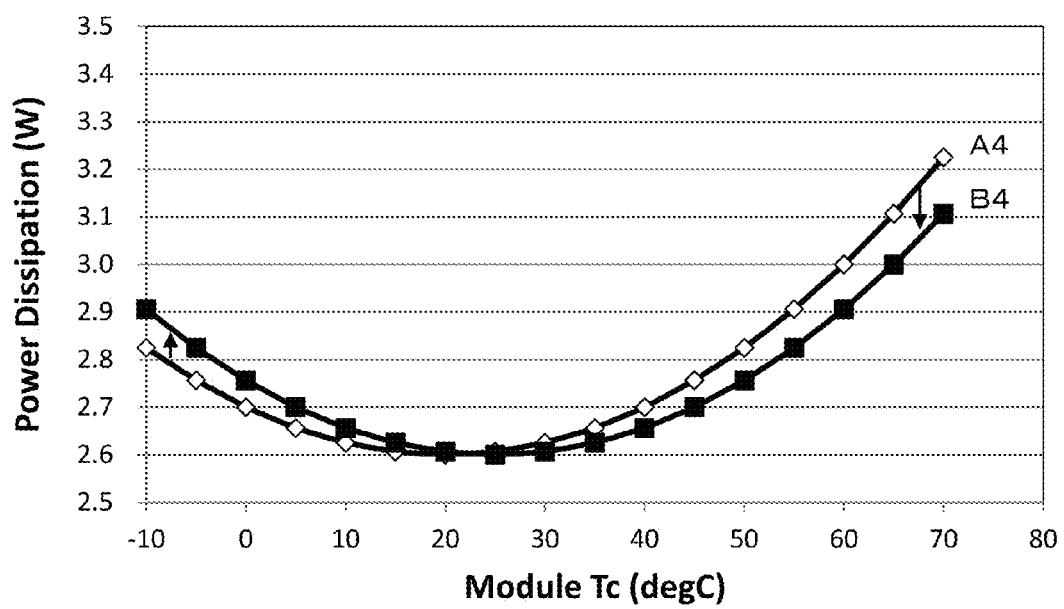
FIGS. 8 to 10 are graphs for explaining an technical effects of the embodiment.

FIG. 8 is a graph illustrating an example of power consumption characteristics with respect to a temperature (Tc) of the laser apparatus (which may be referred to as a "module") 1. In FIG. 8, A4 indicates characteristics in an initial state of Tld constant control (non-optimization control). Meanwhile, B4 indicates characteristics in case where the laser setting temperature Tld is raised under the Tld constant control as described with reference to FIG. 4. It may be understood that the temperature Tc of the module 1 is equivalent to the ambient temperature Ta.

Upon comparison between the characteristics A4 and B4, it is possible to reduce power consumption when the ambient temperature Ta is a temperature (e.g. Ta>20° C.) at which the DBR laser 111 needs to be cooled, according to the Tld constant control (the non-optimization control) by increasing the laser setting temperature Tld. In other words, in case of Ta>20° C., the characteristics B4 bring lower power consumption than that of the characteristics A4.

However, when the ambient temperature Ta is a temperature (e.g. Ta<20° C.) at which the DBR laser 111 needs to be heated, since the magnitude relationship of power consumption between the characteristics A4 and the characteristics B4 is reversed, power consumption increases compared to the initial state (characteristics A4).

Figure 9:
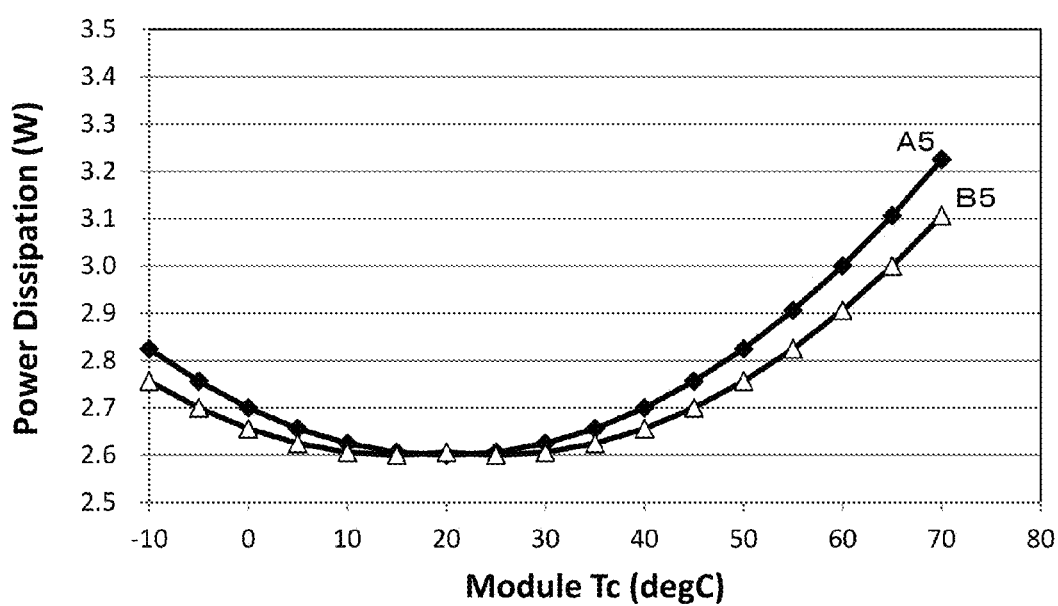

In contrast, FIG. 9 is a graph illustrating an example of power consumption characteristics with respect the temperature of the laser apparatus 1 under the Tld optimization control according to the present embodiment. In FIG. 9, A5 indicates characteristics in an initial state under the Tld optimization control. Meanwhile, B5 indicates characteristics in case where the laser setting temperature Tld is increased under the Tld optimization control as described with reference to FIG. 4.

Upon comparison between the characteristics A5 and B5, even in a temperature (e.g. Ta<20° C.) at which the DBR laser 111 needs to be heated, the magnitude relationship of power consumption between the characteristics A5 and the characteristics B5 is not reversed. This is because, according to the Tld optimization control of the present embodiment, the laser setting temperature Tld is optimized such that a sum of the TEC current and the SOA current is minimized per ambient temperature Ta.

Hence, it is possible to reduce power consumption of the laser apparatus 1 in the entire operational temperature range of the DBR laser 111 (in other words, irrespectively of whether the ambient temperature Ta is a low temperature or a high temperature).

Figure 10:
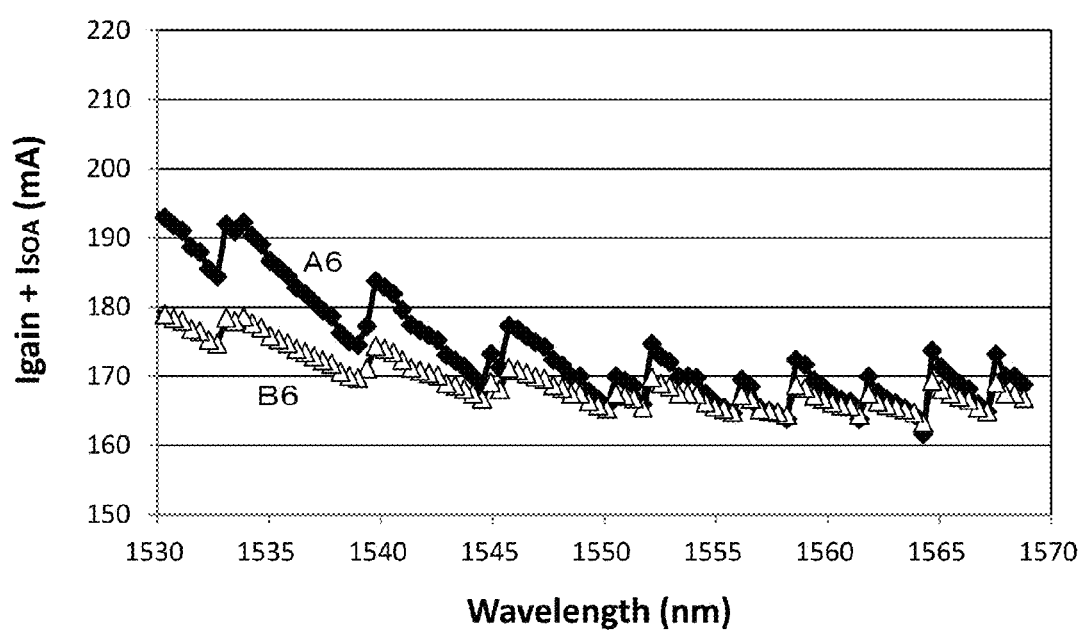

Further, FIG. 10 is a graph illustrating an example of characteristics of a sum of the laser drive current (Igain) and the SOA current (Isoa) with respect to a wavelength. In FIG. 10, A6 indicates characteristics in case where the Igain constant control is performed without performing the laser drive current (Igain) optimization control according to the present embodiment. Meanwhile, B6 indicates characteristics in case where the Igain optimization control according to the present embodiment is performed.

As indicated by the characteristics A6, according to the Igain constant control, a current (Igain+Isoa) of a shorter wavelength side increases due to wavelength dependent gain of the SOA gain.

In contrast, according to the Igain optimization control in the present embodiment, the laser drive current Igain is optimized per laser setting wavelength. Hence, it is possible to suppress an increase in a current (Igain+Isoa) in a tunable wavelength range of the DBR laser 111 as indicated by the characteristics B6. Therefore, it is possible to reduce power consumption of the laser apparatus 1.

(Others)

The "optimization" control of the laser setting temperature (Tld) and the laser drive current (Igain) has been described in the above embodiment. The "optimization" control may be read as control of "minimizing" the above-described sum of the currents. However, as long as a power consumption reduction effect of the laser apparatus 1 is obtained, the "minimization" control does not necessarily need to be performed. For example, when the above-described sum of the currents becomes a predetermined threshold or less rather than a minimum value, it may be considered as achieving a "minimization". Hence, the "optimization control" may be referred to as an "adaptive control".

All examples and conditional language provided herein are intended for pedagogical purposes to aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiment(s) of the present invention have been described in detail, it should be understood that the various changes, substitutions, and alterations could be made hereto without departing from the spirit and scope of the invention.

What is claimed is:

1. A laser apparatus comprising:
a semiconductor laser of which a drive condition is controlled according to a plurality of types of drive currents;
a controller configured to control the drive condition such that a sum of the drive currents is equal to or less than a predetermined threshold value, and to control the drive condition to increase one or more of the drive currents when one or more of the other drive currents is decreased;
a thermoelectric cooler configured to control a temperature of the semiconductor laser at a setting temperature; and
a temperature sensor configured to detect an environmental temperature at which the semiconductor laser operates, wherein
the semiconductor laser includes a semiconductor amplification region configured to amplify a light beam emitted from a gain region of the semiconductor laser,
the plurality of types of drive currents includes a first drive current for the thermoelectric cooler and a second drive current for the semiconductor amplification region,
the control of the drive condition includes temperature control performed by the thermoelectric cooler to control the temperature of the semiconductor laser at the setting temperature, and
the temperature control is performed such that a sum of the first and second drive currents is equal to or less than the threshold value according to the environmental temperature detected by the temperature sensor.

2. The laser apparatus according to claim 1, further comprising a memory configured to store a setting value of the setting temperature per environmental temperature, the setting value of the setting temperature being obtained in advance based on a first relationship and a second relationship and satisfying a condition that the sum is the equal to or less than the threshold value, wherein
the first relationship is a relationship between the setting temperature for the environmental temperature and, the first drive current,
the second relationship is a relationship between the setting temperature for the environmental temperature and temperature dependent loss of output light power of the semiconductor laser corresponding to the temperature control, and
the controller is configured to read from the memory the setting value corresponding to the environmental temperature detected by the temperature sensor to perform the temperature control according to the read setting value.

3. A laser apparatus comprising:
a semiconductor laser of which a drive condition is controlled according to a plurality of types of drive currents;
a controller configured to control the drive condition such that a sum of the drive currents is equal to or less than a predetermined threshold value;
a thermoelectric cooler configured to control a temperature of the semiconductor laser at a setting temperature;
a temperature sensor configured to detect an environmental temperature at which the semiconductor laser operates; and
a monitor configured to monitor output light power of the semiconductor laser, wherein
the semiconductor laser includes a semiconductor amplification region configured to amplify a light beam emitted from a gain region of the semiconductor laser,
the plurality of types of drive currents includes a first drive current for the thermoelectric cooler, a second drive current for the semiconductor amplification region and a third drive current for the gain region,
the control of the drive condition includes temperature control to control the setting temperature of the semiconductor laser at the setting temperature by controlling the first drive current, and output light power control to control one or both of the second and third drive currents such that the output light power monitored by the monitor becomes target power, and
the temperature control and the output light power control are performed such that a sum of the first to third drive currents is maintained at the threshold value or less, based on the environmental temperature detected by the temperature sensor and wavelength dependent gain of the semiconductor amplification region corresponding to a setting of a light emission wavelength of the semiconductor laser.

4. The laser apparatus according to claim 3, further comprising a memory configured to store a setting value of the setting temperature and a setting value of the third drive current per environmental temperature, the setting values being obtained in advance based on a first relationship, a second relationship and a third relationship and satisfying the condition that the sum is equal to or less than the threshold value, wherein
the first relationship is a relationship between the setting temperature for the environmental temperature and the first drive current,
the second relationship is a relationship between the setting temperature for the environmental temperature and temperature dependent loss of output light power of the semiconductor laser corresponding to the temperature control,
the third relationship is a relationship of an amplification gain with respect to the light emission wavelength of the semiconductor amplification region, and
the controller is configured to read from the memory each of the setting values corresponding to the environmental temperature detected by the temperature sensor and a setting of a light emission wavelength of the semiconductor laser to control the setting temperature of the semiconductor laser and perform constant control of the output light power, based on the read setting values.

5. A laser apparatus comprising:
a semiconductor laser of which a drive condition is controlled according to a plurality of types of drive currents;
a controller configured to control the drive condition such that a sum of the drive currents is equal to or less than a predetermined threshold value; and
a monitor configured to monitor output light power of the semiconductor laser, wherein
the semiconductor laser includes a semiconductor amplification region configured to amplify a light beam emitted from a gain region of the semiconductor laser,
the plurality of types of drive currents includes a second drive current for the semiconductor amplification region and a third drive current for the gain region,
the control of the drive condition includes output light power control to control one or both of the second and third drive currents such that the output light power monitored by the monitor becomes target power, and
the output light power control is performed such that a sum of the second and third drive currents is maintained at the threshold value or less, based on wavelength dependent gain of the semiconductor amplification region corresponding to a setting of a light emission wavelength of the semiconductor laser.

6. The laser apparatus according to claim 5, further comprising a memory configured to store a setting value of the third drive current per light emission wavelength, the setting value being obtained in advance based on a relationship between the light emission wavelength and an amplification gain with respect to the light emission wavelength of the semiconductor amplification region,
  wherein the controller is configured to read from the memory the setting value corresponding to a setting of the light emission wavelength of the semiconductor laser to perform constant control of the output light power.

7. An optical transmitter comprising:
a semiconductor laser of which a drive condition is controlled according to a plurality of types of drive currents;
a controller configured to control the drive condition such that a sum of the drive currents is equal to or less than a predetermined threshold value, and to control the drive condition to increase one or more of the drive currents when one or more of the other drive currents is decreased;
a thermoelectric cooler configured to control a temperature of the semiconductor laser at a setting temperature; and
a temperature sensor configured to detect an environmental temperature at which the semiconductor laser operates, wherein
the semiconductor laser includes a semiconductor amplification region configured to amplify a light beam emitted from a gain region of the semiconductor laser,
the plurality of types of drive currents includes a first drive current for the thermoelectric cooler and a second drive current for the semiconductor amplification region,
the control of the drive condition includes temperature control performed by the thermoelectric cooler to control the temperature of the semiconductor laser at the setting temperature, and
the temperature control is performed such that a sum of the first and second drive currents is equal to or less than the threshold value according to the environmental temperature detected by the temperature sensor.

8. An optical transmitter comprising:
a semiconductor laser of which a drive condition is controlled according to a plurality of types of drive currents;
a controller configured to control the drive condition such that a sum of the drive currents is equal to or less than a predetermined threshold value;
a thermoelectric cooler configured to control a temperature of the semiconductor laser at a setting temperature;
a temperature sensor configured to detect an environmental temperature at which the semiconductor laser operates; and
a monitor configured to monitor output light power of the semiconductor laser, wherein
the semiconductor laser includes a semiconductor amplification region configured to amplify a light beam emitted from a gain region of the semiconductor laser,
the plurality of types of drive currents includes a first drive current for the thermoelectric cooler, a second drive current for the semiconductor amplification region and a third drive current for the gain region,
the control of the drive condition includes temperature control to control the setting temperature of the semiconductor laser at the setting temperature by controlling the first drive current, and output light power control to control one or both of the second and third drive currents such that the output light power monitored by the monitor becomes target power, and
the temperature control and the output light power control are performed such that a sum of the first to third drive currents is maintained at the threshold value or less, based on the environmental temperature detected by the temperature sensor and wavelength dependent gain of the semiconductor amplification region corresponding to a setting of a light emission wavelength of the semiconductor laser.

* * * * *